United States Patent [19]

Metz et al.

[11] Patent Number: 4,663,610
[45] Date of Patent: May 5, 1987

[54] SERIAL DIGITAL-TO-ANALOG CONVERTER

[75] Inventors: Arthur J. Metz, Gervais; James S. Lamb, Portland, both of Oreg.

[73] Assignee: Tektronix, Inc., Beaverton, Oreg.

[21] Appl. No.: 801,118

[22] Filed: Nov. 22, 1985

[51] Int. Cl.$^4$ .............................................. H03M 1/00
[52] U.S. Cl. .......................... 340/347 DA; 340/347 M
[58] Field of Search ..................... 340/347 DA, 347 M

[56] References Cited

PUBLICATIONS

Erickson et al, Half-Frequency (2, 7) Decoder, IBM Technical Disclosure Bulletin, vol. 21, No. 2, 7/1978, pp. 807 & 808.
Grebene, Bipolar and MOS Analog Integrated Circuit Design, J. Wiley & Sons, 1984, pp. 754, 755, 782 & 783.

*Primary Examiner*—T. J. Sloyan
*Attorney, Agent, or Firm*—John Smith-Hill; George T. Noe

[57] ABSTRACT

A serial DAC comprises two shift registers having their data input terminals connected together for receiving serial binary data. The shift registers are clocked alternately, whereby each shift register is clocked at substantially half the rate at which data is applied to the data input terminals of the shift registers. Two current switches are associated with the shift registers respectively, each switch being operative to steer input current to one of two output terminals if the data output of the associated shift register is a digital 1 and to steer input current to the other output terminal if the data output is a digital 0. Two current sources supply equal, constant currents to input terminals of the two current switches respectively. A third current switch has two output terminals connected to the input terminals of the first and second switches respectively, and is operative to steer its input current to its two output terminals in alternating fashion, switching between its two output terminals at the same rate as the shift registers are clocked. A third constant current source supplies the third switch with an input current equal to that supplied by the first and second sources, and the current supplied by the third current source is added alternately to the current supplied by the first source and the current supplied by the second source.

6 Claims, 3 Drawing Figures

SERIAL DIGITAL-TO-ANALOG CONVERTER

This invention relates to a serial digital-to-analog converter.

BACKGROUND OF THE INVENTION

A serial digital-to-analog converter (serial DAC) of known type is shown in FIG. 1 of the drawings. This serial DAC comprises a serial in, parallel out shift register 10 composed of D flip-flops 12 and 14 connected in series. Serial data is applied to the D and $\overline{D}$ input terminals of the flip-flop 12, and the Q and $\overline{Q}$ output of the flip-flop 12 are connected to the D and $\overline{D}$ inputs of the flip-flop 14. Clock signals are applied to the respective clock terminals of the flip-flops. Thus, as a stream of serial data is applied to the data input terminals of the flip-flop 12, and clock pulses are applied to the clock terminals of the flip-flops, the data is made available sequentially at the data output terminals of the flip-flops.

The output terminals of the flip-flops 12 and 14 are connected to respective current switches 16 and 18. Each switch comprises a differential amplifier composed of two NPN transistors connected in common emitter configuration. The switches supply differential current $I_{out}$ to their output terminals, which are connected together. The input terminals of the switches 16 and 18 are connected to respective constant current sources 20 and 22. The current source 22 supplies twice the current supplied by the source 20.

If, for example, the sequence of binary digits indicated in the top row of Table I was applied to the input of the flip-flop 12, and a clock transition was applied to the clock inputs for each occurrence of the numeral 1 in the second row of the table, the Q outputs of the flip-flops 12 and 14 would respond to the clock transition by entering the states indicated in the third and fourth rows of the table. The output current $I_{out}$ would have the value indicated in the fourth row of Table I.

TABLE I

| Data In | 1 |   | 0 |   | 0 |   | 0 |   | 0 |   | 1 |   | 1 |   | 0 |   | 0 |   | 0 |   | 1 |   | * |
|---------|---|---|---|---|---|---|---|---|---|---|---|---|---|---|---|---|---|---|---|---|---|---|---|
| CLK | 1 | 0 | 1 | 0 | 1 | 0 | 1 | 0 | 1 | 0 | 1 | 0 | 1 | 0 | 1 | 0 | 1 | 0 | 1 | 0 | 1 | 0 |   |
| $Q_{12}$ | 1 |   | 0 |   | 0 |   | 0 |   | 0 |   | 1 |   | 1 |   | 0 |   | 0 |   | 0 |   | 1 |   | * |
| $Q_{14}$ | * |   | 1 |   | 0 |   | 0 |   | 0 |   | 0 |   | 1 |   | 1 |   | 0 |   | 1 |   | 0 |   | 1 |
| $I_{out}$ | * |   | 1 |   | 0 |   | 0 |   | 0 |   | 1/2 |   | 3 1/2 |   | 1 |   | 0 |   | 0 |   | 1/2 |   | * |

This type of serial DAC may be used in an analog-to-digital converter (ADC), where a digital pseudo random bit sequence is converted to analog form and summed with an analog signal for noise dithering.

A disadvantage of the DAC shown in FIG. 1 is that the switch 12 can take up to twice as long to settle as the switch 16, because it has to switch twice the current. (The settling time of the switch 16 or 18 may be defined as the time that elapses from the clock transition until the output current is within a specified percentage of its final value.) Moreover, assuming that the output drive capabilities of the flip-flops 12 and 14 are equal, the flip-flop 14 will take longer to settle in response to a change in its output signal because of the higher capacitive loading owing to the higher current being switched. Even if the current switches are much faster than the flip-flops, there may be parasitic currents proportional to the flip-flop output. Consequently, the MSB stage, comprising the flip-flop 14 and the current switch 18, takes substantially longer to settle than lower order stages, and this imposes a limit on the rate at which data can be applied to the DAC and accurately converted.

SUMMARY OF THE INVENTION

In a preferred embodiment of the invention, a serial DAC comprises two shift registers having their data input terminals connected together for receiving serial binary data, and means for clocking the shift registers alternately, whereby each shift register is clocked at substantially half the rate at which data is applied to the data input terminals of the shift registers. Two current switches are associated with the shift registers respectively, each switch being operative to steer input current to one of two output terminals if the data output of the associated shift register is a digital 1 and to steer input current to the other output terminal if the data output is a digital 0. Two current sources supply equal, constant currents to input terminals of the two current switches respectively. A third current switch has two output terminals connected to the input terminals of the first and second switches respectively, and is operative to steer its input current to its two output terminals in alternating fashion, switching between its two output terminals at the same rate as the shift registers are clocked. A third constant current source supplies the third switch with an input current equal to that supplied by the first and second sources, and the current supplied by the third source is added alternately to the current supplied by the first source and the current supplied by the second source.

In operation, as the nth bit in a digital data stream is received and is clocked to the output of the first shift register, for example, the state of the second shift register, with the (n−1)th bit at its output, is unchanged. The third switch responds to the clock by directing the current from the third current source to the second current switch instead of to the first switch. The second switch, which previously controlled the (MSB−1) current, then controls the MSB current, while the first switch, which previously controlled the MSB current, controls the (MSB−1) current. When the (n+1)th bit is received, it is clocked to the output of the second shift register while the state of the first shift register remains unchanged. The third current switch steers the current supplied by the third current source to the first switch, and the first and second switches then control the MSB and the (MSB−1) currents respectively. Therefore, the switch that controls the MSB current during the interval between two clock pulses controlled the (MSB−1) current during the previous clock interval, and its associated shift register was in the same state. The maximum current that must be switched by the first or second switch between two consecutive data bits is equal to the current supplied by the first or second current source.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 2:
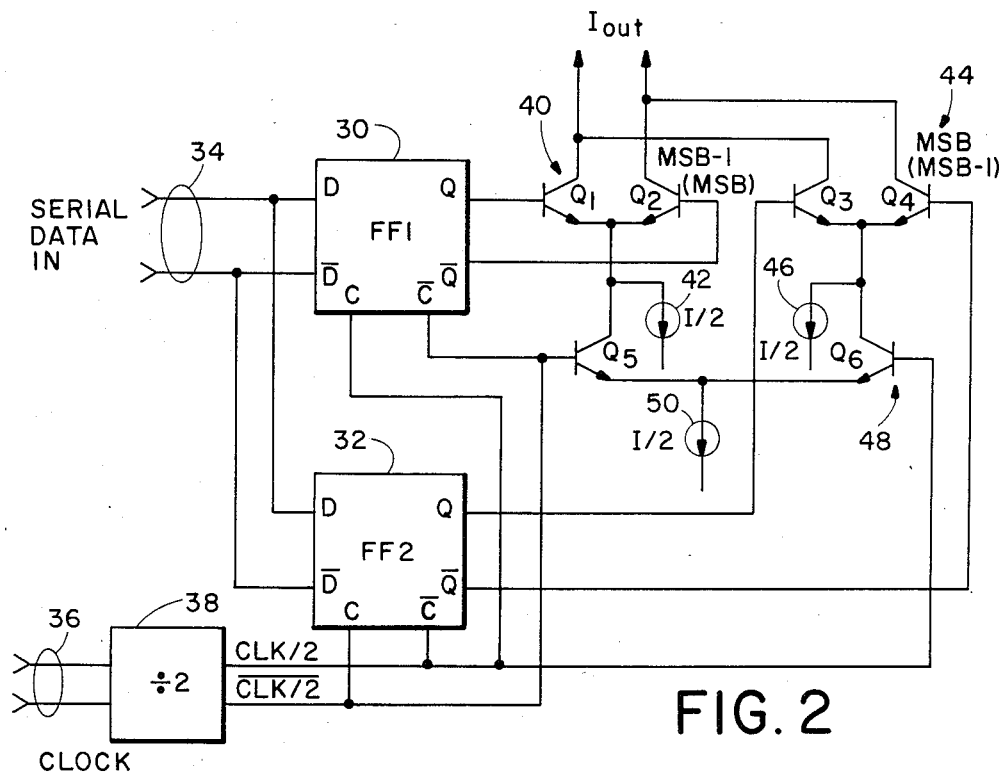
FIG. 2 is a simplified schematic diagram of a first serial DAC embodying the present invention.

The serial DAC shown in FIG. 2 comprises two interleaved shift registers composed of respective D flip-flops 30 and 32. The data input terminals of the flip-flops 30 and 32 are connected to the data input terminal 34 of the DAC. The clock terminal 36 of the DAC is connected to a frequency divider 38, which provides clock signals CLK/2 and $\overline{\text{CLK}/2}$, out of phase with each other and at half the frequency of the clock signal applied to the clock terminal 36. The Q and $\overline{Q}$ terminals of the flip-flop 30 are connected to a first current switch 40 having its input terminal connected to a constant current source 42. Similarly, the Q and $\overline{Q}$ terminals of the flip-flop 32 are connected to a current switch 44 having its input terminal connected to a constant current source 46. The output terminals of the frequency divider 38 are connected to the clock terminals of flip-flops 30 and 32 in reversed fashion, and are also connected to a third current switch 48 that has its input terminal connected to a constant current source 50 and has its output terminals connected to the input terminals of the switches 40 and 44. The three current sources 42, 46 and 50 supply equal currents. It will readily be seen that when the clock terminals C and $\overline{C}$ of the flip-flop 30 are at logical 1 and logical 0 respectively, the clock terminals C and $\overline{C}$ of the flip-flop 32 are at logical 0 and logical 1 respectively and the switch 48 steers current from the current source 50 to the input terminal of the switch 44, so that the switch 44 switches twice the current that is switched by the switch 40. When the levels of the clock terminals C and $\overline{C}$ of the flip-flop 30 are reversed, the switch 48 steers the current supplied by the source 50 to the switch 40. Therefore, when the data stream shown in the top row of Table I is applied to the input terminal of the DAC shown in FIG. 2, the conditions indicated in Table II apply on the consecutive clock pulses.

flip-flop, and minimizes flip-flop parasitic current at the output. Because the two shift registers are interleaved, they are clocked at half the data rate and this makes it possible to use shift registers having a lower power dissipation for a given data rate than in the case of FIG. 1.

It will be seen that if the nth bit is clocked to the output of the flip-flop 30, for example, the switch 48 delivers current to the switch 44, and therefore the maximum current to be switched by the switch 40 is I/2 whereas the current to be switched by the switch 44 is I. The (n+1)th bit is clocked to the output of the flip-flop 32, and at this time the switch 48 is directing current to the switch 40. Therefore, while the output data of the flip-flop 30 remains constant, the current supplied to the switch 40 increases by I/2.

Figure 3:
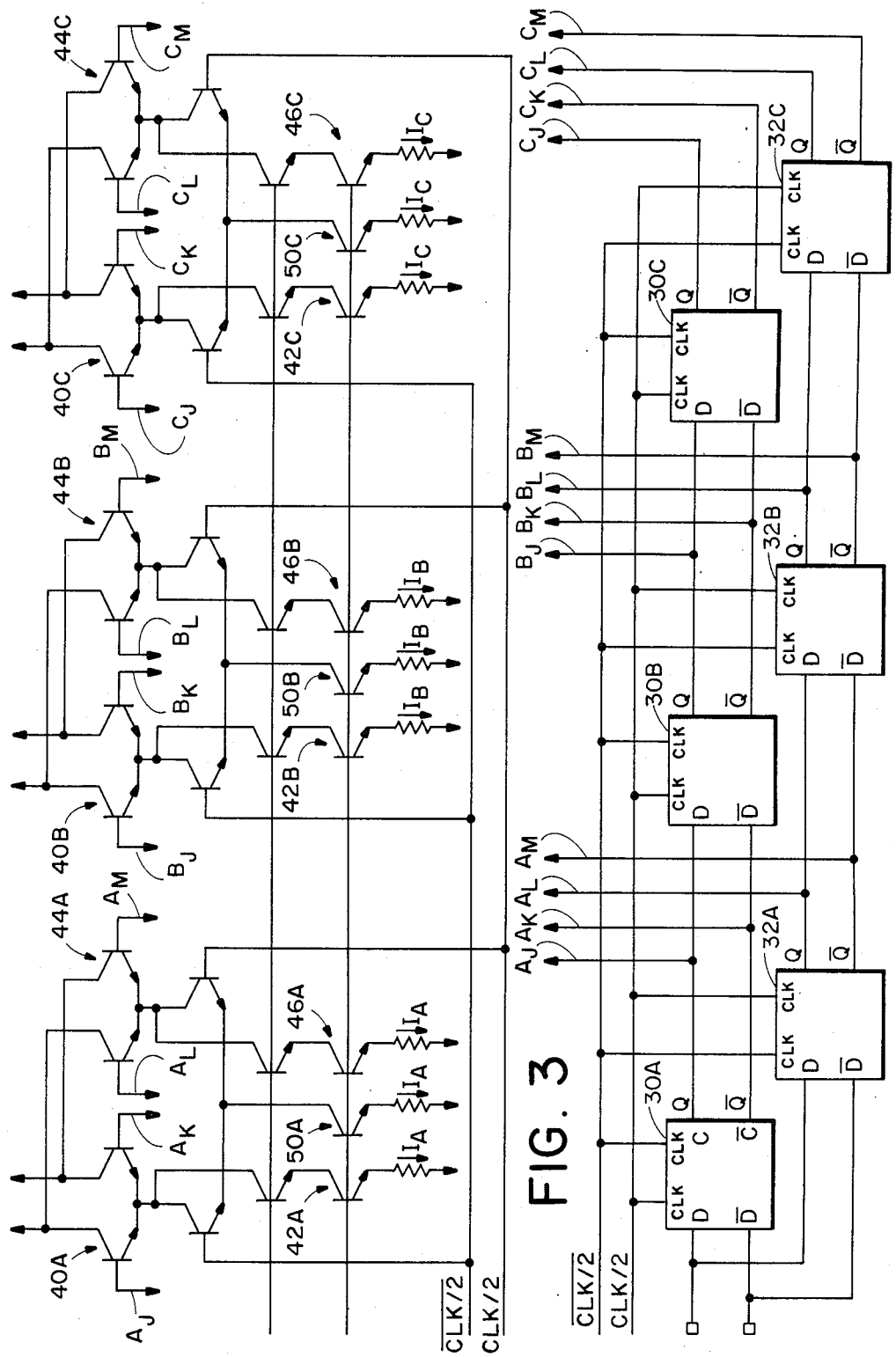
FIG. 3 is a more detailed schematic diagram of a second serial DAC embodying the invention.

The serial DAC shown in FIG. 3 is a 6-bit DAC, in which each of the interleaved shift registers comprises three flip-flops. In FIGS. 2 and 3, the same reference numerals are used to denote corresponding elements, with suffixes (A, B or C) being used in FIG. 3 to denote the three stages of each shift register and the corresponding components of the current switches. If the nth bit in a data stream is clocked into the shift register 30, and is therefore made available at the Q output terminal of the stage 30A, on clocking of the (n+2)th bit into the register 30 the nth bit is made available at the Q output terminal of the stage 30B and on clocking of the (n+4)th bit into the register it advances to the stage 30C. The currents $I_A$, $I_B$ and $I_C$ are in the ratio 1:4:16, and consequently a change from 0 to 1 (or vice versa) in the signal applied to the input terminal of the DAC first affects the two lowest order bits (through the switches 40A and 44A), then the two intermediate bits and finally the two highest order bits. This ensures that if, for example, the Q output terminals of all flip-flops were at logical 0 following the (n−1)th bit and the nth bit was a logical 1, the digital output of the DAC would become 000001, rather than 010000 and the change in output current of the DAC would be $I_A/2$ rather than $I_C/2$. The output currents of the switches 40A, 44A, 40B, 44B, 40C and 44C are applied to a ladder resistor network to develop appropriate voltages.

It will be appreciated that the present invention is not

TABLE II

| Data In | 1 | 0 | 0 | 0 | 0 | 1 | 1 | 0 | 0 | 0 | 1 | * |
| --- | --- | --- | --- | --- | --- | --- | --- | --- | --- | --- | --- | --- |
| CLK | 1 | 0 1 | 0 1 | 0 1 | 0 1 | 0 1 | 0 1 | 0 1 | 0 1 | 0 1 | 0 1 | |
| CLK/2 | 1 | 0 | 1 | 0 | 1 | 0 | 1 | 0 | 1 | 0 | 1 | |
| $\overline{\text{CLK}/2}$ | 0 | 1 | 0 | 1 | 0 | 1 | 0 | 1 | 0 | 1 | 0 | |
| $Q_{30}$ | * 1 | 1 | 0 | 0 | 0 | 0 | 1 | 1 | 0 | 0 | 1 | * |
| $Q_{32}$ | * | * 0 | 0 | 0 | 0 | 1 | 1 | 0 | 0 | 0 | 0 | * |
| $I_{40}$ | 1/2 | 1 | 1/2 | 1 | 1/2 | 1 | 1/2 | 1 | 1/2 | 1 | 1/2 | |
| $I_{44}$ | I | 1/2 | I | 1/2 | I | 1/2 | I | 1/2 | I | 1/2 | I | |
| $I_{out}$ | * | 1 | 0 | 0 | 0 | 1/2 | 3I/2 | 1 | 0 | 0 | 1/2 | * |

Figure 1:
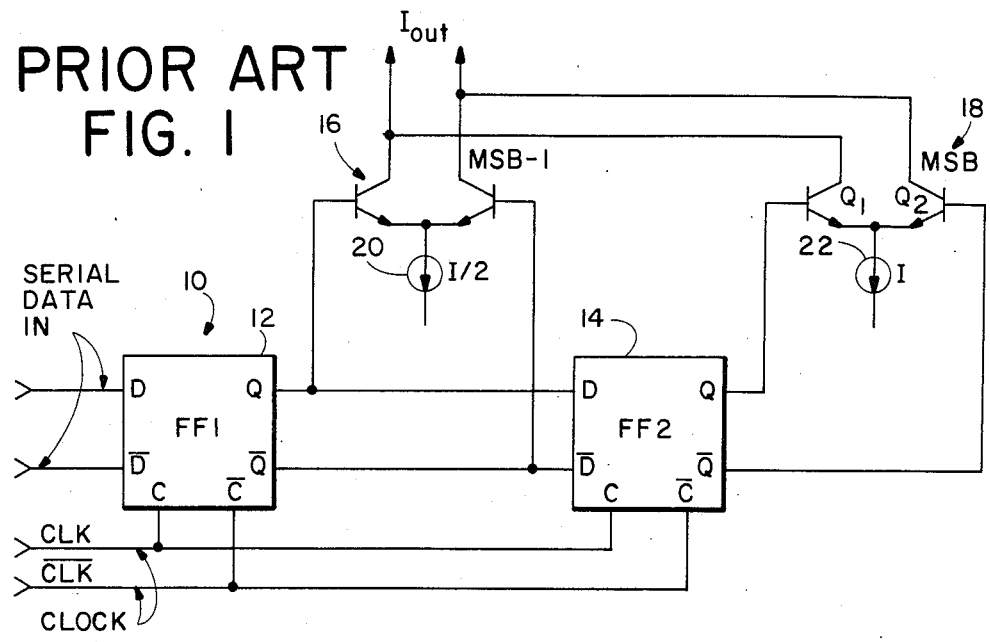
FIG. 1 is a simplified schematic diagram of a serial DAC of known kind.

It will be seen that the output current of the FIG. 2 DAC varies in the same manner as the output current of the FIG. 1 DAC. However, the FIG. 2 DAC provides the significant advantage that the two switches 40 and 44 switch the same maximum current, and that the maximum amount by which the current controlled by any switch changes is I/2. Consequently, the settling time of the FIG. 2 DAC may be reduced substantially as compared with the FIG. 1 DAC. Also, because of the inherent delay in the flip-flops from clock to data, the current standing in the switch changes prior to a change in the data input to the switch. This reduces the loading on the restricted to the particular serial DACs that have been described and illustrated, and that variations may be made therein without departing from the scope of the invention as defined in the appended claims and equivalents thereof. For example, the number of stages in the shift registers is not critical.

We claim:

1. A digital-to-analog converter comprising:
   first and second shift registers each having a data input terminal for receiving binary digits that are synchronized with a clock pulse train, a data output terminal and a clock terminal, such that on application of a clock pulse to the clock terminal a binary digit present at the data input terminal is made available at the output terminal, the data input terminals of the first and second shift registers being connected together;

means for applying clock pulses alternately to the clock terminals of the first and second shift registers, whereby each shift register receives clock pulses at substantially half the repetition rate of the clock pulse train;

first and second current switches associated with the first and second shift registers respectively, each switch having a current input terminal and two current output terminals and being operative to steer current supplied to its current input terminal to one of its two current output terminals if the binary digit at the output of the associated shift register has one of two possible values and to steer current to the other of its two current output terminals if the binary digit has the other of the two possible values;

first and second current sources for supplying equal, constant currents and connected to the current input terminals of the first and second current switches respectively;

a third current switch having a current input terminal and two current output terminals, the current output terminals being connected to the current input terminals of the first and second switches respectively and the third switch being operative to steer current supplied to its current input terminal to its two current output terminals in alternating fashion in response to successive clock pulses applied to the first shift register, and a third current source for supplying a constant current and connected to the current input terminal of the third current switch.

2. A digital-to-analog converter according to claim 1, wherein each shift register comprises at least one D flip-flop.

3. A digital-to-analog converter according to claim 1, wherein each shift register has two complementary data output terminals and each current switch comprises a differential amplifier having two data input terminals connected to the complementary data output terminals respectively of the associated shift register.

4. A digital-to-analog converter according to claim 3, comprising a divide-by-two circuit for receiving an input clock signal having a reception rate equal to the rate at which data is applied to the shift registers and for providing two complementary clock signals having half the repetition rate of the input clock signal, and wherein the third current switch comprises a differential amplifier having two control terminals connected for receiving the two complementary clock signals respectively.

5. A digital-to-analog converter (DAC) comprising:
first and second serial in, parallel out shift registers each having N stages, where N is a positive integer, each shift register having a data input terminal for receiving binary digits at a predetermined data rate, first through Nth output terminals and a clock terminal, such that on application of a clock pulse to the clock terminal the binary digit present at the input terminal is made available at the first output terminal and the binary digits present at the first through (N−1)th output terminals are made available at the second through Nth output terminals, the data input terminals of the two shift registers being connected together;

means for applying clock pulses to the clock terminals of each of the first and second shift registers at a rate equal to substantially half of the data rate at which binary digits are applied to the data input terminals and in alternating fashion;

first and second current switch arrays associated with the first and second shift registers respectively, each switch array comprising N switches associated respectively with the N stages of the associated shift register and each switch having a current input terminal and two current output terminals and being operative to steer current supplied to its current input terminal to one of its two current output terminals if the binary digit at the associated output terminal of the associated shift register has one of two values and to steer current to the other of its two current output terminals if the binary digit at the associated output terminal has the other of the two values;

2 N current sources supplying equal, constant currents and connected to the current input terminals of the current switches respectively;

a third array of current switches comprising N switches each having a current input terminal and two current output terminals, the ith (where i is an integer from 1 to N) switch of the third array having its current output terminals connected to the input terminals of the ith switches of the first and second arrays respectively and being operative to steer current supplied to its input terminal to its two output terminals in alternating fashion in response to consecutive clock pulses; and N additional current sources supplying currents and connected respectively to the current input terminals of the N switches of the third array.

6. A digital-to-analog converter comprising:
P shift registers, where P is a positive integer greater than 1, each shift register having a data input terminal for receiving binary digits at a predetermined data rate, first through Nth output terminals, where N is a positive integer, and a clock terminal, such that on application of a clock pulse to the clock terminal the binary digit present at the data input terminal is made available at the first output terminal and the binary digits present at the first through (N−1)th output terminals are made available at the second through Nth output terminals respectively, the data input terminals of the P shift registers being connected together;

means for applying clock pulses sequentially to the clock terminals of the P shift registers, whereby each shift register receives clock pulses at substantially one−pth of the predetermined data rate;

P current switch arrays associated with the P shift registers respectively, each switch array comprising N switches associated respectively with the N output terminals of the associated shift register and each switch having a current input terminal and two current output terminals and being operative to steer current supplied to its current input terminal to one of its two current output terminals if the binary digit at the associated output terminal has one of two values and to steer current to the other of its two current output terminals if the binary digit has the other of the two possible values;

N×P current sources for supplying equal, constant currents and connected to the current input terminals of the current switches respectively;

an array of N additional current switches each having a current input terminal and P current output terminals, the ith (where i is an integer from 1 to N) switch of the array of additional current switches having its P current output terminals connected respectively to the current input terminals of the ith current switches of the P current switch arrays and each additional switch being operative to steer current supplied to its current input terminal to its P current output terminals sequentially; and N additional current sources for supplying constant currents and connected to the current input terminals of the N additional current switches respectively.

* * * * *